United States Patent
Reddy

(10) Patent No.: US 7,800,297 B2
(45) Date of Patent: Sep. 21, 2010

(54) NANOSTRUCTURED ELECTROLUMINESCENT DEVICE AND DISPLAY

(75) Inventor: Damoder Reddy, Los Gatos, CA (US)

(73) Assignee: Solexant Corp., San Jose, CA (US)

( * ) Notice: Subject to any disclaimer, the term of this patent is extended or adjusted under 35 U.S.C. 154(b) by 457 days.

(21) Appl. No.: 11/676,912

(22) Filed: Feb. 20, 2007

(65) Prior Publication Data

US 2007/0194694 A1 Aug. 23, 2007

Related U.S. Application Data

(60) Provisional application No. 60/774,794, filed on Feb. 17, 2006.

(51) Int. Cl.
*H01L 51/00* (2006.01)
(52) U.S. Cl. .................. 313/504; 313/503; 313/506
(58) Field of Classification Search .............. 313/503, 313/504, 506
See application file for complete search history.

(56) References Cited

U.S. PATENT DOCUMENTS

| | | | | |
|---|---|---|---|---|
| 4,945,009 | A | * | 7/1990 | Taguchi et al. .............. 428/690 |
| 5,537,000 | A | | 7/1996 | Alivisatos et al. |
| 5,720,827 | A | | 2/1998 | Simmons .................... 136/250 |
| 5,958,573 | A | * | 9/1999 | Spitler et al. ................ 428/323 |
| 6,023,073 | A | | 2/2000 | Strite |
| 6,023,128 | A | * | 2/2000 | Grothe et al. .............. 313/506 |
| 6,049,090 | A | | 4/2000 | Clark, Jr. |
| 6,121,541 | A | | 9/2000 | Arya |
| 6,399,177 | B1 | | 6/2002 | Fonash et al. |
| 6,608,439 | B1 | | 8/2003 | Sokolik et al. |
| 6,657,378 | B2 | * | 12/2003 | Forrest et al. ............... 313/503 |
| 6,878,871 | B2 | | 4/2005 | Scher et al. |

(Continued)

FOREIGN PATENT DOCUMENTS

EP 1 176 646 A 1/2002

(Continued)

OTHER PUBLICATIONS

Coe, et al., "Electroluminescence from single monolayers of nanocrystals in molecular organic devices," *Nature*, 420:800-803 (2002).

(Continued)

*Primary Examiner*—Nimeshkumar D Patel
*Assistant Examiner*—Peter R Haderlein
(74) *Attorney, Agent, or Firm*—Morgan Lewis & Bockius LLP; Richard F. Trecartin

(57) ABSTRACT

An electroluminescent device contains (1) first and second electrodes, at least one of which is transparent to radiation; (2) a hole conducting layer containing first nanoparticles wherein the hole conducting layer is in contact with said first electrode; (3) an electron conducting layer containing second nanoparticles where the electron conducting layer is in contact with the hole conducting layer and the second electrode; and optionally (4) a voltage source capable of providing positive and negative voltage, where the positive pole of the voltage source is connected to the first electrode and the negative pole is connected to the second electrode. In some embodiments, the electroluminescent device also includes an electron-hole combination layer between the hole and electron conducting layers.

23 Claims, 11 Drawing Sheets

U.S. PATENT DOCUMENTS

| | | |
|---|---|---|
| 6,919,119 B2 | 7/2005 | Kalkan et al. |
| 6,949,206 B2 | 9/2005 | Whiteford et al. |
| 6,995,371 B2 | 2/2006 | Garber et al. |
| 2003/0127973 A1 | 7/2003 | Weaver et al. |
| 2003/0226498 A1 | 12/2003 | Alivisatos et al. |
| 2004/0023010 A1 | 2/2004 | Bulovic |
| 2004/0031519 A1 | 2/2004 | Andriessen ............... 136/252 |
| 2004/0067324 A1 | 4/2004 | Lazarev et al. ............ 428/1.31 |
| 2004/0095658 A1 | 5/2004 | Buretea et al. |
| 2004/0118448 A1 | 6/2004 | Scher et al. |
| 2004/0150328 A1 | 8/2004 | Czerw et al. |
| 2004/0178390 A1 | 9/2004 | Whiteford et al. |
| 2004/0197546 A1 | 10/2004 | Rinzler et al. .......... 428/311.51 |
| 2004/0219348 A1 | 11/2004 | Jacquiod et al. .......... 428/304.4 |
| 2005/0009224 A1 | 1/2005 | Yang et al. |
| 2005/0045851 A1 | 3/2005 | He et al. |
| 2005/0098204 A1 | 5/2005 | Roscheisen et al. ......... 136/263 |
| 2005/0116633 A1* | 6/2005 | Yamazaki et al. ........... 313/506 |
| 2005/0126628 A1 | 6/2005 | Scher et al. |
| 2005/0133087 A1 | 6/2005 | Alivisatos et al. |
| 2005/0150541 A1 | 7/2005 | Scher et al. |
| 2005/0150542 A1 | 7/2005 | Madan |
| 2005/0155641 A1 | 7/2005 | Fafard ........................ 136/249 |
| 2005/0021192 A1 | 9/2005 | Chittibabu et al. |
| 2005/0194586 A1* | 9/2005 | Satou et al. ................. 257/40 |
| 2005/0214967 A1 | 9/2005 | Scher et al. |
| 2005/0224113 A1 | 10/2005 | Xue et al. |
| 2005/0253502 A1 | 11/2005 | Gokturk ..................... 313/503 |
| 2005/0279399 A1 | 12/2005 | Gaudiana et al. |
| 2006/0019427 A1 | 1/2006 | Cao |
| 2006/0063029 A1* | 3/2006 | Jang et al. ................... 428/690 |
| 2006/0088713 A1 | 4/2006 | Dykstra et al. |
| 2006/0112983 A1 | 6/2006 | Parce et al. |
| 2006/0207644 A1 | 9/2006 | Robinson et al. ............ 136/243 |
| 2006/0263922 A1 | 11/2006 | Levitsky et al. |
| 2007/0006914 A1 | 1/2007 | Lee |
| 2007/0012355 A1 | 1/2007 | LoCascio et al. |
| 2007/0090371 A1 | 4/2007 | Dreschel et al. |
| 2007/0114937 A1 | 5/2007 | Jang |
| 2007/0137697 A1 | 6/2007 | Kempa et al. |
| 2008/0066802 A1 | 3/2008 | Reddy |
| 2008/0110494 A1 | 5/2008 | Reddy |
| 2009/0009062 A1 | 1/2009 | Kathirgamanathen et al. |

FOREIGN PATENT DOCUMENTS

| | | |
|---|---|---|
| KR | 10-2005-0112938 | 12/2005 |
| WO | WO 2004/083958 | 9/2004 |

OTHER PUBLICATIONS

Adachi, et al., "Endothermic energy transfer: A mechanism for generating very efficient high-energy phosphorescent emission in organic materials," *Applied Physics Letters*, 79(13) 2082-2084 (2001).

Cho, et al., "Efficient Photodetection at IR Wavelengths by Incorporation of PbSe-Carbon-Nanotube Conjugates in a Polymeric Nanocomposite," *Adv. Mater.*, 19:232-236 (2007).

Choudhury, et al., "Efficient Photosensitization and High Optical Gain in a Novel Quantum-Dot-Sensitized Hybrid Photorefractive Nanocomposite at a Telecommunications Wavelength," *Adv. Funct. Mater.*, 15(5):751-756 (2005).

Choudhury, et al, "Efficient photoconductive devices at infrared wavelengths using quantum dot-olymer nanocomposites," *Applied Physics Letters*, 87:073110-1 thru -3 (2005).

D'Andrade, et al., "High-efficiency yellow double-doped organic light-emitting devices based on phosphor-sensitized fluorescence," *Applied Physics Letters*, 79(7):1045-1047 (2001).

Deng, "High-efficiency Amorphous Silicon Thin Film Solar Cells," *The University of Toledo*, 2 pages.

Geisz, et al., "Lattice-Matched GaNPAs-on-Silicon Tandem Solar Cells," *NREL*, Conference Paper Prepared for the 31st IEEE Photovoltaics Specialists Conference and Exhibition, Lake Buena Vista, Florida, 7 pages (2005).

Gur, et al., "Air-Stable All-Inorganic Nanocrystal Solar Cells Processed from Solution," *Science*, 310:462-465 (2005).

Haremza, et al., "Attachment of Single CdSe Nanocrystals to Individual Single-Walled Carbon Nanotubes," *Nano Letters*, 2(11):1253-1258 (2002).

Hu, et al., "Progress in Four-Terminal Nano-Crystalline SI/Amorphous SI Solar Cells," *IEEE*, pp. 1452-1455 (2005).

Kongkanand, et al., "Single Wall Carbon Nanotube Scaffolds for Photoelectrochemical Solar Cells. Capture and Transport of Photogenerated Electrons," *Nano Letters*, 0:0A-E:5-9 (2007).

Landi, et al., "Quantum Dot-Single Wall Carbon Nanotube Complexes for Polymeric Photovoltaics," *Mater. Res. Soc. Symp. Proc.*, 836:L2.8.1-L28.6 (2005).

Law, et al., "Nanowire dye-sensitized solar cells," *Nature Materials*, 4:455-459 (2005).

Lloyd, et al., "Photovoltaic cells from a soluble pentacene derivative," *Elsevier, Organic Electronics*, pp. 1-6 (2006).

Madan, "Flexible displays and stable high efficiency four terminal solar cells using thin film silicon technology," *Elsevier, Surface & Coatings Technology*, pp. 1907-1912 (2005).

Madan, "Amorphous silicon- from doping to multi-billion dollar applications," *Invited talk: presented at ICANS21*, Lisbon, Portugal, pp. 1-14 (2005).

Maria, et al., "Solution-processed infrared photovoltaic devices with >10% monochromatic internal quantum efficiency," *Applied Physics Letters*, 87:213112-1 thru -3 (2005).

Milliron, et al., Hybrid Organic-Nanocrystal Solar Cells, *MRS Bulletin*, 30:41-44 (2005).

Mor, et al., "Use of Highly-Ordered $TiO_2$ Nanotube Arrays in Dye-Sensitized Solar Cells," *Nano Letters*, 0:0(A-D), 4 pages (2005).

Nozik, "Quantum Dot Solar Cells," *NREL*, Conference Paper presented at the NCPV Review Meeting, Lakewood, Colorado, 4 pages (2001).

Paulose, et al., "Backside illuminated dye-sensitized solar cells based on titania nanotube array electrodes," *Nanotechology*, 17:1-3 (2006).

Ruan, et al., "Enhanced photoelectrochemical-response in highly ordered $TiO_2$ nanotube-arrays anodized in boric acid containing electrolyte," *Elsevier, Solar Enegy Materials & Solar Cells*, 13 pages (2005).

Sargent, "Infrared Quantum Dots," *Adv. Mater.*, 17(5):515-522 (2005).

Varghese, et al., "Water-Photolysis Properties of Micron-Length Highly-Ordered Titania Nanotube-Arrays," *J. Nanosci. Nanotech*, 5(7):1158-1165(2005).

Yoo, et al., "Efficient thin-film organic solar cells based on pentacene/ $C_{60}$ heterojunctions," *Applied Physics Letters*, 85(22):5427-5429 (2004).

Yoo, et al., "Intensity-dependent equivalent circuit parameters of organic solar cells based on pentacene and $C_{60}$," *Journal of Applied Physics*, 97:103706-1 thru 9 (2005).

Zhang, et al., Enhanced infrared photovoltaic efficiency in PbS nanocrystal/semiconducting polymer composites: 600-fold increase in maximum power output via control of the ligand barrier. *Applied Physics Letters*, 87:233101-1 thru -3 (2005).

International Preliminary Report on Patentability dated Jun. 18, 2009, received in PCT patent application No. PCT/US2007/086600, which corresponds to U.S. Appl. No. 11/951,545 (related).

European Office Action dated Feb. 17, 2009, received in EP patent application No. 07757078.6 which corresponds to U.S. Appl. No. 11/675,586 (related).

Bayon et al., "Highly structured $TiO_2/In(OH)_xS_y/PbS/PEDOT$: PSS for photovoltaic applications," *Solar Energy Materials & Solar Cells, Elsevier*, vol. 89, No. 1, Oct. 14, 2005, pp. 13-25.

Chen et al., "Electrochemically synthesized CdS nanoparticle-modified $TiO_2$ nanotube-array photoelectrodes: Preparation, characterization, and application to photoelectrochemical cells," *Journal of Photochemistry and Photobiology, A: Chemistry, Elsevier*, vol. 177, No. 2-3, Jan. 25, 2006, pp. 177-184.

Greenham et al., "A CdSe nanocrystal/MEH-PPV polymer composite photovoltaic," *AIP Conference Proceedings, American Institute of Physics*, vol. 404, Mar. 24, 1997, pp. 295-302.

Landi et al., "CdSe Quantum dot-single wall carbon nanotube complexes for polymeric solar cells," *Solar Energy Materials & Solar Cells*, vol. 87, No. 1-4, May 1, 2005, pp. 733-746.

Loscutova et al., "Coating single-walled carbon nanotubes with cadmium chalcogenides," *Journal of Materials Chemistry*, vol. 15, No. 40, Oct. 28, 2005, pp. 4346-4353.

Plass et al., "Quantum Dot Sensitization of Organic—Inorganic Hybrid Solar Cells," *Journal of Physical Chemistry B, American Chemical Society*, vol. 106, No. 31, Jul. 16, 2002, pp. 7578-7580.

Raffaelle et al., "Quantum Dot—Single Wall Carbon Nanotube Complexes for Polymeric Solar Cells," *Photovoltaic Specialists Conference*, Jan. 3, 2005, pp. 74-77.

Tena-Zaera et al., "Fabrication and characterization of ZnO nanowires/CdSe/CuSCN *eta*-solar cell," *Comptes Rendus—Chimie, Elsevier*, Paris, vol. 9, No. 5-6, Sep. 15, 2005, pp. 717-729.

Vogel et al., "Quantum—Sized PbS, CdS, $Ag_2S$, $Sb_2S_3$, and $Bi_2S_3$ Particles as Sensitizers for Various Nanoporous Wide-Bandgap Semiconductors," *Journal of Physical Chemistry, American Chemical Society*, vol. 98, No. 12, 1994, pp. 3183-3188.

International Search Report and Written Opinion dated Feb. 26, 2008, for International Application No. PCT/US 07/04213, which corresponds to U.S. Appl. No. 11/708,072.

International Search Report and Written Opinion dated Jul. 18, 2007, for International Application No. PCT/US2007/062265, which corresponds to U.S. Appl. No. 11/675,586.

International Search Report and Written Opinion dated Jul. 11, 2007, for International Application No. PCT/US2007/062445, which corresponds to U.S. Appl. No. 11/676,912.

International Search Report and Written Opinion dated Jun. 10, 2008, for International Application No. PCT/US2007/064720, which corresponds to U.S. Appl. No. 11/690,094.

International Search Report and Written Opinion dated Oct. 6, 2008, for International Application No. PCT/US 07/86600, which corresponds to U.S. Appl. No. 11/951,545.

McDonald et al., Solution-Processed PbS Quantum Dot Infared Phtodetectors and Photovoltaics, *Nature Materials* vol. 4, pp. 138-142 (2005).

Goho, Infared Vision: New Material May Enhance Plastic Solar Cells, *Science News*, (2005).

Landi et al.,"CdSe Quantum Dot-Single Wall Carbon Nanotube Complexes for Polymeric Solar Cells", *Solar Energy Materials and Solar Cells*, vol. 87, pp. 743-746 (2005).

Landi et al., "Quantom Dot-Single Wall Carbon Nanotube Complexes for Polymeric Photovoltaics" *Materials Research Society Symposium Proceedings*, vol. 386, pp. L.2.8.1-L.2.8.6, 2005.

* cited by examiner

Light

NANOSTRUCTURED ELECTROLUMINESCENT DEVICE AND DISPLAY

CLAIM OF PRIORITY

This application claims the benefit of U.S. Provisional Application Ser. No. 60/774,794, filed Feb. 17, 2006, under 35 U.S.C. §119(e) and is incorporated herein by reference in its entirety.

FIELD OF THE INVENTION

The invention relates to electroluminescent devises and emissive displays containing them.

BACKGROUND OF THE INVENTION

Emissive displays fall under three categories depending on the type of emissive device in the display: (1) Organic Light Emitting Displays (OLED), (2) Field Emission Displays (FED) and (3) Inorganic Thin Film Electroluminescent Displays (EL). Of these three categories, OLEDs have received the most attention and investment around the world. Approximately 100 companies are developing various aspects of the OLED technology. Commercial OLED products are in the mobile phone and MP3 markets. OLED devices can be made from small molecules (pioneered by Kodak) or polymers (pioneered by Cambridge Display Technology). OLED devices can also be made from phosphorescent materials (pioneered by Universal Display Technology). More than 90% of the commercial products use Kodak's fluorescent small molecule materials. Polymer materials, on the other hand, offer lower cost manufacturing by using solution processing techniques such as spin coating and ink-jet printing. Polymeric materials are expected to offer a cost effective solution for large size (>20") OLED displays. Phosphorescent materials offer higher efficiencies and reduce power consumption.

OLED displays suffer from several materials based and manufacturing process dependant problems. For example, OLEDs have short lifetimes, loss of color balance over time, and a high cost of manufacturing. The poor lifetime and color balance issues are due to the chemical properties of emissive device in the OLED. For example, it is difficult to improve the lifetime of blue OLEDs because the higher energy in the blue spectrum tends to destabilize the organic molecules used in the OLED. The cost of manufacturing small molecule full color displays is also very high due the need to use expensive shadow masks to deposit red, green and blue materials. Kodak and others have developed white OLEDs by using color filter technology to overcome this problem. However, the use of color filters adds cost to the bill of materials and reduces the quality of display. Some of the main advantages of the OLED display are being taken away by this approach.

Polymeric materials offer a possible route to achieve low cost high volume manufacturing by using ink-jet printing. However, polymers have even shorter lifetimes compared to small molecules. Lifetimes must increase by an order of magnitude before polymer materials can be commercially viable.

The next generation emissive display technology is expected to be based on newly emerging nanomaterials called quantum dots (QD). The emission color in the QDs can be adjusted simply by changing the dimension of the dots. The usefulness of quantum dots in building an emissive display has already been demonstrated in QD-OLED. See Seth Coe et al., *Nature* 420, 800 (2002). Emission in these displays is from inorganic materials such as CdSe which are inherently more stable than OLED materials. Stable blue materials can be achieved simply by reducing the size of the quantum dots.

Display devices made with QDs have quantum efficiencies which are an order of magnitude lower than OLED. QDs have been combined with OLED materials to improve efficiency. See US2004/0023010. However, this approach produces only modest improvement in efficiency while decreasing the display lifetime and complicating the manufacturing process.

SUMMARY OF THE INVENTION

The electroluminescent device contains (1) first and second electrodes, at least one of which is transparent to radiation; (2) a hole conducting layer containing first nanoparticles wherein the hole conducting layer is in contact with the first electrode; (3) an electron conducting layer containing second nanoparticles where the electron conducting layer is in contact with the hole conducting layer and the second electrode; and optionally (4) a voltage source capable of providing positive and negative voltage, where the positive pole of the voltage source is connected to the first electrode and the negative pole is connected to the second electrode.

In some embodiments, the electroluminescent device also includes an electron-hole combination layer between the hole and electron conducting layers. The electron-hole combination layer can be a layer of metal or metal oxide. It can also be a layer of metal or metal oxide in combination with the first and/or second nanoparticles used in the hole and/or electron conducting layers. The electron-hole combination layer can also be a sintered layer where the aforementioned components are treated, typically with heat, to coalesce the particles into a solid mass. An electron-hole combination layer can also be made at the junction of the hole-conducting and electron-conducting layers by simply sintering these two layers in the absence of metal or metal oxide. In general, the electron-hole combination layer is 5-10 nanometers thick.

The electroluminescent device can also include a hole injection layer that is between the first electrode and the hole conducting layer. The hole injection layer can contain a p-type semiconductor, a metal or a metal oxide. Typical metal oxides include aluminum oxide, zinc oxide or titanium dioxide, whereas typical metals include aluminum, gold or silver. The p-type semiconductor can be p-doped Si.

The electroluminescent device can also include an electron injection layer that is between the second electrode and the electron conducting layer. This electron injection layer can be a metal, a fluoride salt or an n-type semiconductor. Examples of fluoride salt include NaF, $CaF_2$, or $BaF_2$.

The nanoparticles used in the hole conducting and electron-conducting layer are nanocrystals. Exemplary nanocrystals include quantum dots, nanorods, nanobipods, nanotripods, nanomultipods, or nanowires. Such nanocrystals can be made from CdSe, ZnSe, PbSe, CdTe, InP, PbS, Si or Group II-VI, II-IV or III-V materials.

In some electroluminescent devices, a nonostructure such as a nanotube, nanorod or nanowire can be included in the hole conducting, electron-conducting and/or electron-hole combination layer. A preferred nanostructure is a carbon nanotube. When nanostructures are used, it is preferred that the nanoparticles be covalently attached to the nanostructure.

These quantum dots are of nanometer size. Small dots absorb in the blue end of the spectrum while the large size dots absorb in the red end of the spectrum.

Figure 2:
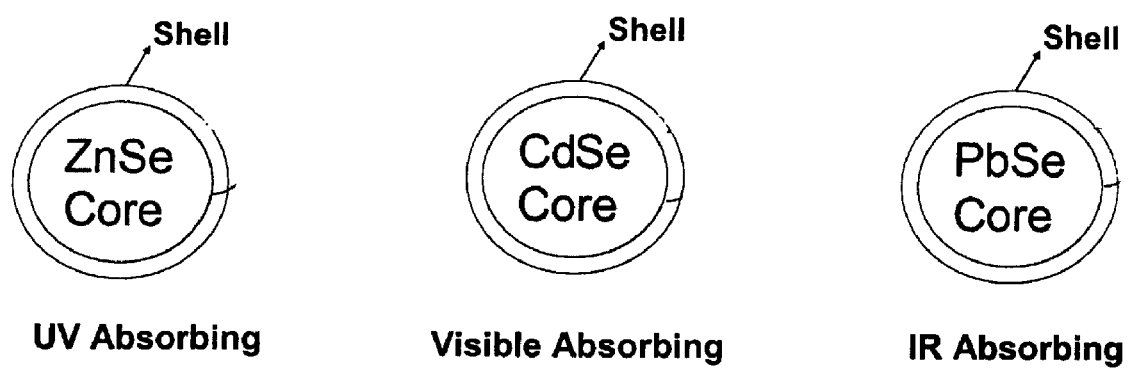
Figure 3:
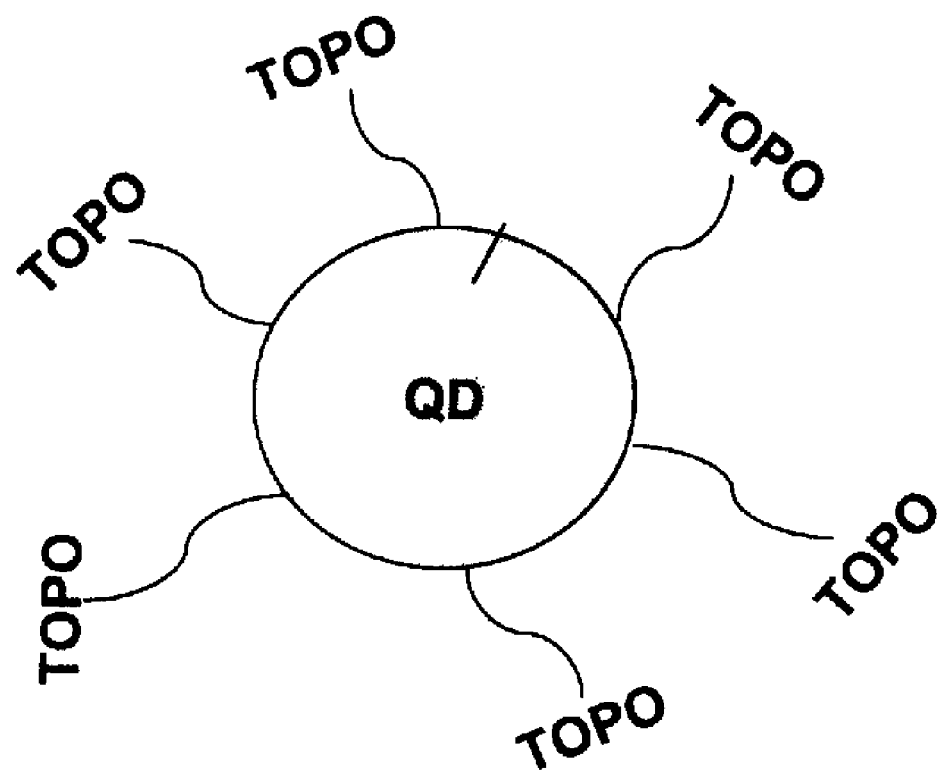

FIG. 2 (Prior Art) depicts quantum dots of the same size made from ZnSe, CdSe and PbSe that absorb and emit in UV, visible and IR respectively FIG. 3 (Prior Art) depicts nanoparticles capped with a solvent such as tr-n-octyl phosphine oxide (TOPO)

Figure 4:
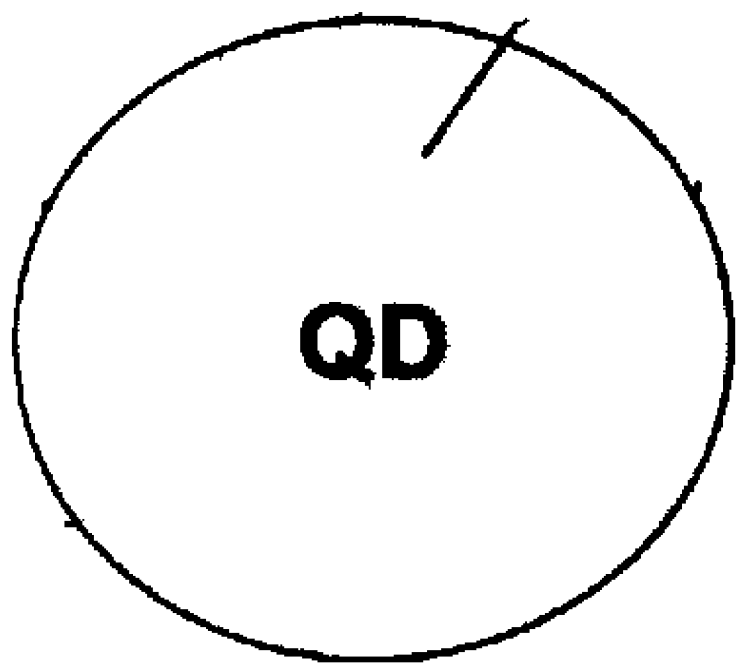

FIG. 4 depicts nanoparticles functionalized with a linker.

Figure 5:
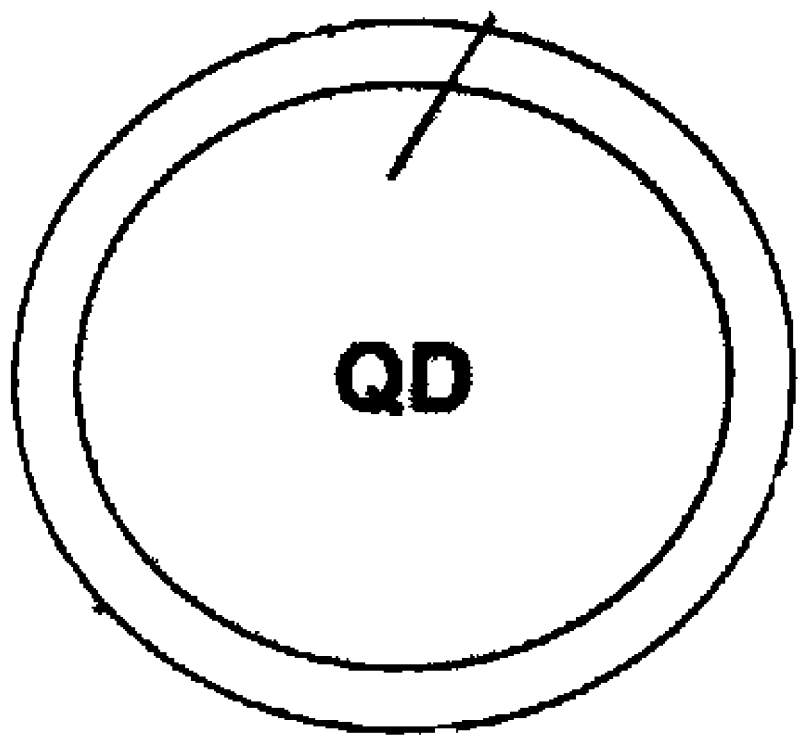

FIG. 5 depicts core-shell nanoparticles functionalized with a linker.

FIG. 6-11 depict various embodiments of the nanostructured electroluminescent device.

DETAILED DESCRIPTION

The electroluminescent device contains (1) two electrodes, at least one of which is transparent to radiation, (2) a hole conducting layer containing first nanoparticles, and (3) an electron conducting layer comprising second nanoparticles. The first and second nanoparticles are different either in composition and/or size. In addition, the first and second nanoparticles are chosen such that the first particles of the hole conducting layer conduct holes while the second particles of the electron conducting layer conduct electrons. The nanoparticles are chosen so that their relative bandgaps produce a Group II band offset. CdTe and CdSe are nonoparticles that present a Group II band offset. However, different nanoparticles can be chosen having different composition and/or size so long as the conduction and valence hands form a Type II band offset. The electroluminescent device optionally includes a voltage source capable of providing a positive and negative voltage. When present, the positive pole of the voltage source is electrically connected to the first electrode and hence to the hole conducting layer while the negative pole is connected to the second electrode and hence connected to the electron conducting layer.

Figure 6:
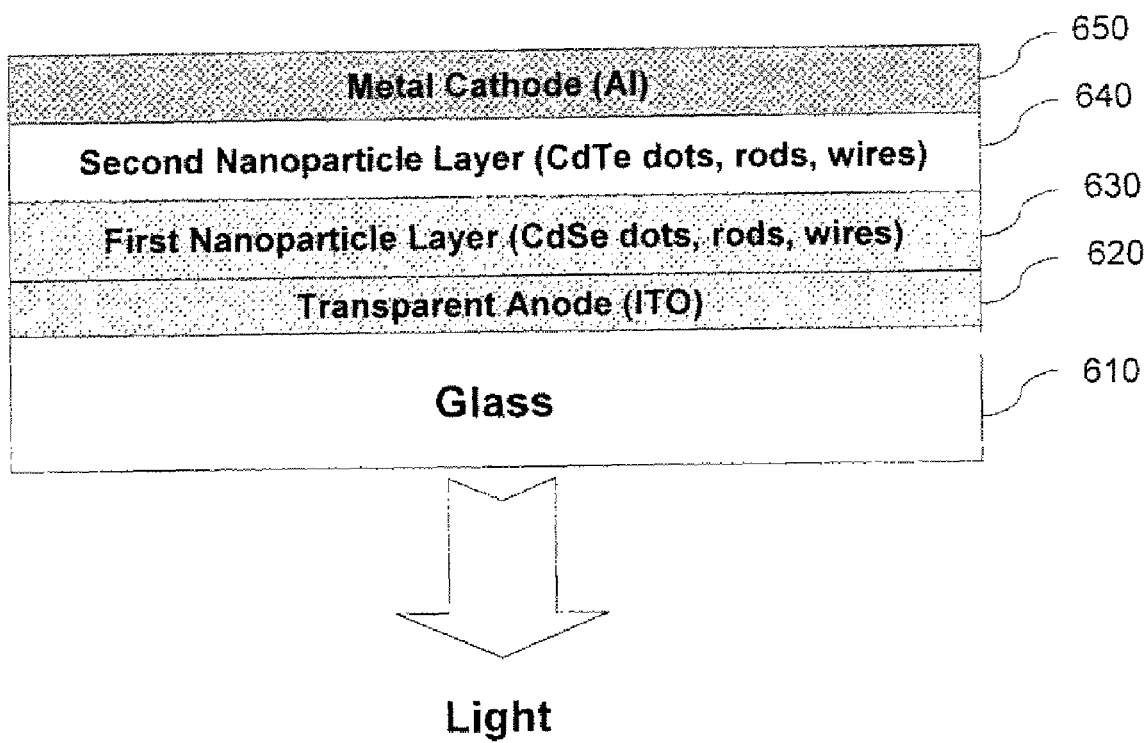

In some embodiments, an electron-hole combination layer is placed between the hole and electron conducting layers. The electron-hole combination layer can comprise a metal, a metal oxide, or a mixture of a metal or metal oxide with the nanoparticles of the hole conducting layer or the nanoparticles of the electron conducting layer. In some cases, the metal or metal oxide is in combination with the nanoparticles of the hole conducting layer as well as the nanoparticles of the electron conducting layer. The type of electron-hole conducting layer present in an electroluminescent device will depend upon its method of manufacture. FIG. 6 shows an electroluminescent device without a power source. In FIG. 6, a transparent anode such as indium tin oxide (620) is formed on the glass substrate (610). A first nanoparticle layer is then deposited followed by a second nanoparticle layer. A metal cathode (650) is then formed on the second nanoparticle layer. The entire device can then be annealed/sintered so as to form a continuous layer between the first and second nanoparticle layers and an electron-hole combination layer. The electron-hole combination layer is formed between the two layers and is made from nanoparticles from the hole and electron conducting layers. It is in this region that electrons and holes combine with each other to emit light when a positive and negative voltage is placed across the device. The radiation emitted may be dependent upon the difference between the conduction band energy of the electron conducting nanoparticles and the valence band energy of the hole conducting nanoparticles. It is to be understood that the emitted radiation need not correlate exactly to the differences in such energy levels. Rather, light having energy less than this band gap may be expected.

If a layer of metal or metal oxide is positioned between the first and second nanoparticle layers, an electron-hole combination layer is formed. If the metal or metal oxide is placed on the first nanoparticle layer and then sintered prior to the addition of the second nanoparticle layer, the electron-hole combination layer comprises not only the metal or metal oxide but also nanoparticles derived from the first layer. Alternatively, the second nanoparticle layer can be deposited upon the metal or metal oxide layer and the device then sintered. In this case, the electron-hole combination layer comprises metal or metal oxide in combination with nanoparticles from the first and second layers. If the device is made by first depositing the hole conducting layer, followed by a layer metal or metal oxide and sintered, the electron-hole combination layer comprises metal or metal oxide in combination with nanoparticles from the hole conducting layer.

Figure 7:
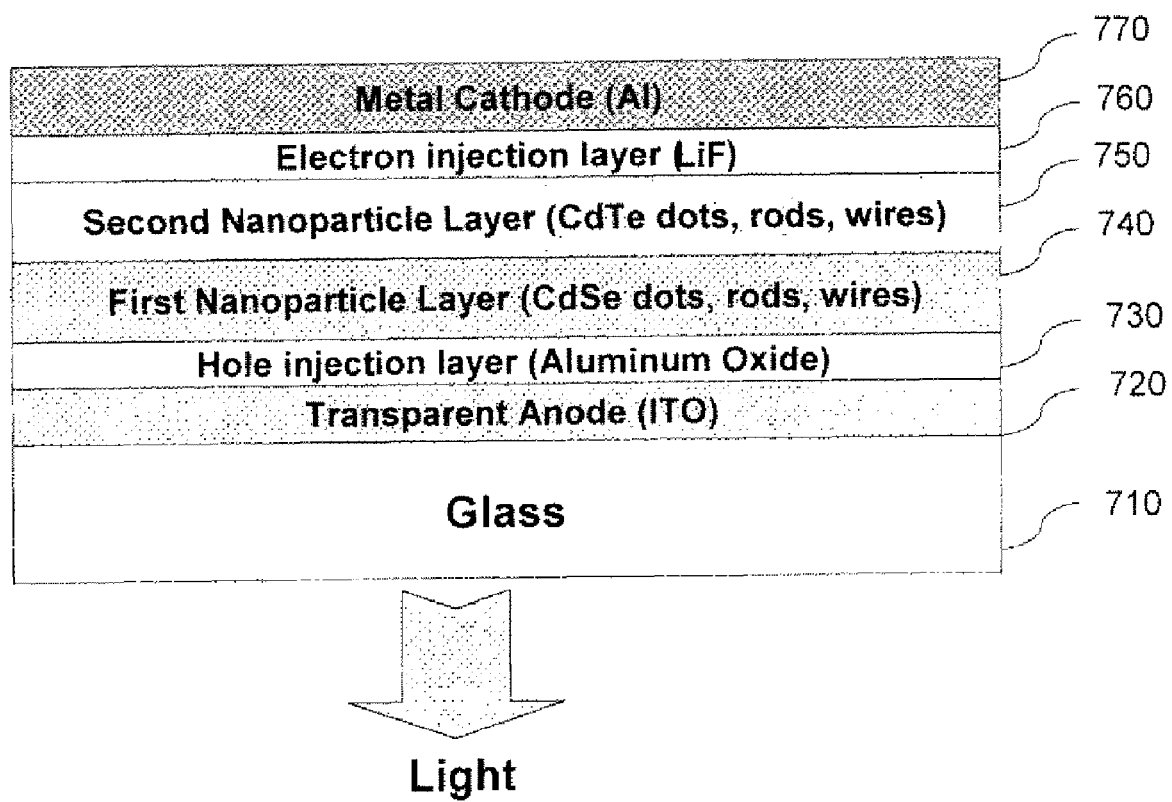

The electroluminescent device may further contain an electron injection layer and/or a hole-injection layer. Referring to FIG. 7, the electron injection layer is positioned between the second nanoparticle layer and the cathode. Electron injection layers can include n-type semiconductors, fluoride salts or metals. The n-type semi-conductor can be for example, n-doped silicon while the fluoride salt can be sodium chloride, calcium chloride or barium fluoride. When fluorides are used the layer can be 0.5 to 2 nanometers thick. When metals are used, the layer can be 5 to 20 nanometers thick.

Figure 8:
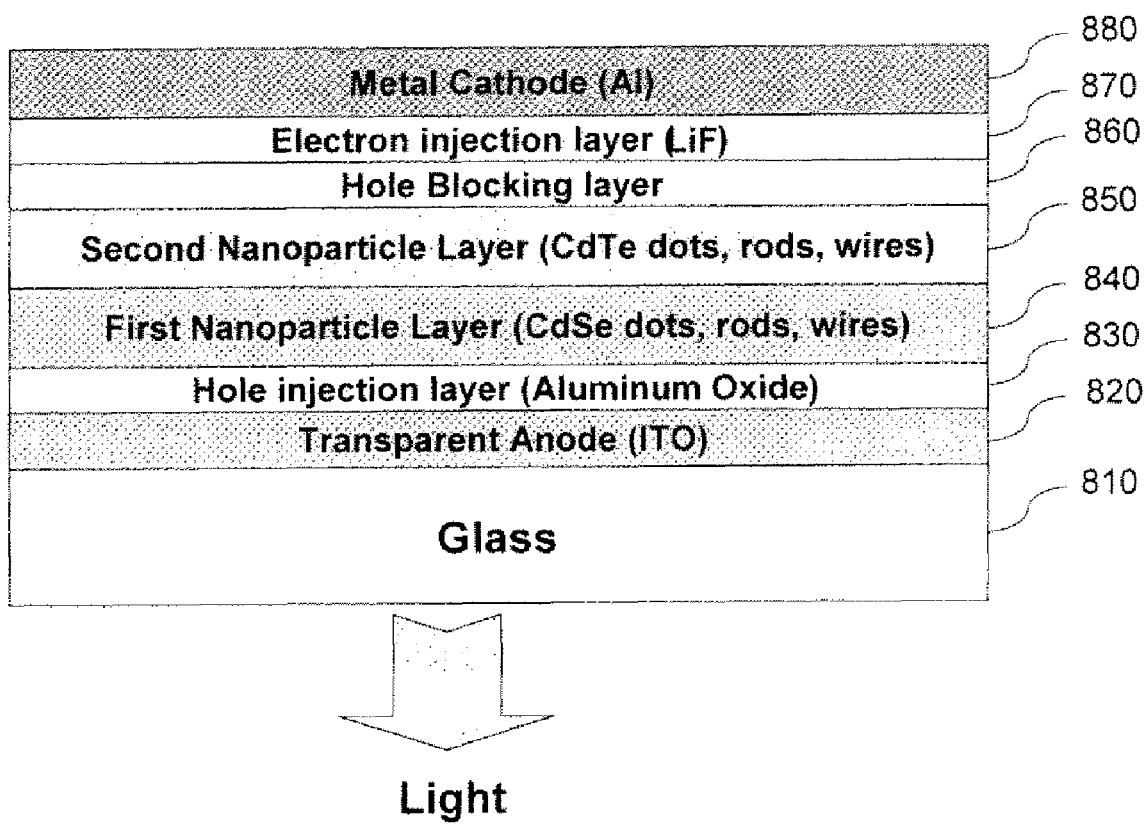

The hole injection layer (730) can be a p-type semiconductor, a metal or a metal oxide. The metal oxide can be, for example, aluminum oxide, zinc oxide, or titanium dioxide whereas the metal can be aluminum, gold or silver. An example of a p-type semiconductor that can be used as a hole injection layer is p-doped silicon. In FIG. 8, a hole blocking layer (860) is added to the embodiment previously set forth in FIG. 7. Examples of the hole blocking layers include $TiO_2$, ZnO and other metal oxides with a bandgap greater than 3 eV.

In addition, an electron blocking layer can be disposed between the anode and the first nanoparticle layer or between the hole injection layer and the first nanoparticle layer. Examples of electron blocking layers include those made from $TiO_2$.

It is to be understood that an electron injection layer can also act as a hole blocking layer. However, in some embodiments two different materials can be used where one acts as an electron injection layer and the other a hole blocking layer. For example, an electron injection layer can be LiF, BaF or CaF while the hole blocking layer can be $TiO_2$.

Similarly, at the anode, the hole injection layer can also act as an electron barrier. However, when different materials are used for these functions, the hole injection layer can be made from Au while the electron barrier layer can be made from $Al_2O_3$.

As used herein, the term "nanoparticle" or "luminescent nanoparticle" refers to luminescent materials that generate light upon the combination of holes and electrons. Luminescent nanoparticles are generally nanocrystals such as quantum dots, nanorods, nanobipods, nanotripods, nanomultipods or nanowires.

Luminescent nanoparticles can be made from compound semiconductors which include Group II-VI, II-IV and III-V materials. Some examples of luminescent nanoparticles are CdSe, ZnSe, PbSe, InP, PbS, ZnS, CdTe Si, Ge, SiGe, CdTe, CdHgTe, and Group II-VI, II-IV and III-V materials. Luminescent nanoparticles can be core type or core-shell type. In a core-shell nanoparticle, the core and shell are made from different materials. Both core and shell can be made from compound semiconductors.

The nanoparticles of the hole conducting layer have a bandgap such that holes are easily transferred from the anode to these nanoparticles. The nanoparticles of the electron conduction layer have a bandgap such that electrons can easily transfer from cathode to these nanoparticles. Bandgaps of the materials used for the hole and electron conducting layers will be complimentary to each other to allow efficient recombination of holes and electrons in the electron-hole combination layer.

Figure 1:
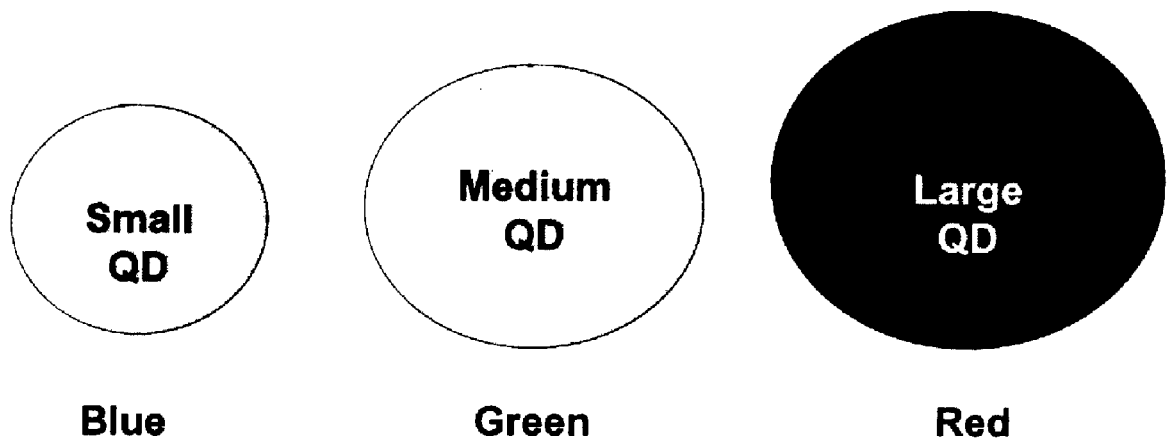
FIG. 1 (Prior Art) depicts quantum dots that absorb and emit at different colors because of their size differences.

Quantum dots are a preferred type of nanoparticle, As in known in the art, quantum dots having the same composition but having different diameters absorb and emit radiation at different wave lengths. FIG. 1 depicts three quantum dots made of the same composition but having different diameters. The small quantum dot absorbs and emits in the blue portion of the spectrum; whereas, the medium and large quantum dots absorb and emit in the green and red portions of the visible spectrum, respectively. Alternatively, as shown in FIG. 2, the quantum dots can be essentially the same size but made from different materials. For example, a UV-absorbing quantum dot can be made from zinc selenide; whereas, visible and IR quantum dots can be made from cadmium selenide and lead selenide, respectively. Nanoparticles having different size and/or composition are used in each of the nanoparticle layers.

The luminescent nanoparticle can be modified by reaction with a linker $X_a—R_n—Y_b$ where X and Y can be reactive moieties such as carboxylic acid groups, phosphonic acid groups, sulfonic acid groups, amine containing groups etc., a and b are independently 0 or 1 where at least one of a and b is 1, R is a carbon, nitrogen or oxygen containing group such as $—CH_2—$, $—NH—$ or $—O—$, and n is 0-10 or 0-5. One reactive moiety (e.g., X) can react with the nanoparticle while the other (Y) can react with another structure such as (1) the electrode, (2) the electron-hole combination layer, (3) the hole or electron injection layer, (4) the hole or electron blocking layer, or (5) other nanoparticles. In some embodiments, the luminescent nanoparticles are used to decorate nanostructures which are then used in the electron and/or hole conducting layers. The linkers, with or without a second reactive moiety, can also passivate the nanoparticles and increase their stability and electroluminescence. They can also improve the nanoparticle solubility or suspension in common organic solvents used to make the charge conducting layers.

By adjusting the components of $X_a—R_n—Y_b$, the distance between the surface of a nanoparticle and any of the aforementioned structure can be adjusted to minimize the effect of surface states that can facilitate electron-hole combination outside of the electron-hole combination layer. The distance between these surfaces is typically 10 Angstroms or less preferably 5 Angstroms or less. This distance is maintained so that electrons or holes can tunnel through this gap from the electrodes to the electron-hole combination layer.

As used herein, the term "nanostructure," "electron conducting nano-structure" or "hole conducting nanostructure" refers to nanotubes, nanorods, nanowires, etc. Electron and hole conducting nanostructures are crystalline in nature. In general, the nanostructures are made from wide band gap semiconductor materials where the band gap is, for example, 3.2 eV for $TiO_2$. The nanostructures are chosen so that their band gap is higher than the highest band gap of the photoactive nanoparticle to be used in the solar cell (e.g., >2.0 eV).

Electron conducting nanostructures can be made, for example, from titanium dioxide, zinc oxide, tin oxide, indium tin oxide (ITO) and indium zinc oxide. The nanostructures may also be made from other conducting materials, such as carbon nanotubes, especially single-wall carbon nanotubes.

Electron conducting nanostructures can be prepared by methods known in the art. Conducting nanostructures can also be prepared by using colloidal growth facilitated by a seed particle deposited on the substrate. Conducting nanostructures can also be prepared via a vacuum deposition process such as chemical vapor deposition (CVD), metal-organic chemical vapor deposition (MOCVD), Epitaxial growth methods such as molecular beam epitaxy (MEB), etc.

In the case of nanotubes, the outside diameter of the nanotube ranges from about 20 nanometers to 100 nanometers in some cases from 20 nanometers to 50 nanometers, and in others from 50 nanometers to 100 nanometers. The inside diameter of the nanotube can be from about 10 to 80 nanometers, in some cases from 20 to 80 nanometers, and in others from 60 to 80 nanometers. The wall thickness of the nanotube can be 10-25 nanometers, 15-25 nanometers, or 20-25 nanometers. The length of the nanotube in some cases is 100-800 nanometers, 400-800 nanometers, or 200-400 nanometers.

In the case of nanowires, the diameters can be from about 100 nanometers to about 200 nanometers and can be as long as 50-100 microns. Nanorods can have diameters from about 2-200 nanometers but often are from 5-100 or 20-50 nanometers in diameter. Their length can be 20-100 nanometers, but often are between 50-500 or 20-50 nanometers in length.

As described above, the electroluminescent device (without a voltage source) does not include an organic hole conducting polymer or an organic electron conducting polymer. Except when organic linkers are used, the device is essentially entirely inorganic.

The electroluminescent devices can be used in emissive displays. Emission displays include flat panel displays (alone or in combination with other components associated with a finished product) as well as other electronic devices.

EXAMPLES

Example 1

A nanostructured electroluminescent device is shown in FIG. 6, a transparent conducting layer ITO 620 is deposited on glass substrate (610) by following methods well known in the art. The surface of the ITO can be exposed to plasma treatment or other processes well known in the art to adjust the work function of ITO. A first charge conducting nanoparticle layer (630) is then deposited on the ITO layer. Spin coating or ink-jet printing or other printing process can be used to deposit nanoparticles dispersed in a suitable solvent. A continuous pin hole free nanoparticle layer can be obtained by heating the substrate to about 200 C for about 15 minutes to drive off the solvent. The nanoparticles in layer 630 can be dots, rods or wires. The first nanoparticle layer in this embodiment is made from CdSe. Second nanoparticle layer (640) is deposited directly on top of the first nanoparticle layer (630). Spin coating or ink-jet printing or other printing process can be used to deposit nanoparticles dispersed in a suitable solvent. A continuous pin hole free nanoparticle layer can be obtained by heating the substrate to about 200 C for about 15 minutes to drive off the solvent. The nanoparticles in layer 640 can be dots, rods or wires. The second nanoparticle layer (640) in this embodiment is made form CdTe. The particle size of the CdSe in the first nanoparticle layer (630) and CdTe in the second nanoparticle layer (640) can be adjusted to obtain the desired emission colors. To produce blue emission 3 micron dots can be used. To produce red emission 6 micron dots can be used. Other colors can be produced by adjusting the nanoparticle size by using methods well known in the art. Interface between the two nanoparticle layers can be improved by heating the substrate in a saturated $CdCl_2$ solution in methanol or by methods well known in the art. Such a treatment creates a suitable interface between the first nanoparticle layer and the second nanoparticle layer such that efficient electron-hole combination occurs at the interface. A aluminum metal electrode (650) is then deposited on top of the second nanoparticle layer to complete the nanostructured electroluminescent device.

Example 2

Another embodiment of a nanostructured electroluminescent device is shown in FIG. 7. A transparent conducting layer ITO (720) is deposited on glass substrate (710). As described in Example 1, a hole injection layer (730) such as aluminum oxide is deposited on ITO layer 720 by the methods known in the art. The first and second nanoparticle layers (740 and 750), are then deposited as described in Example 1. An electron injecting layer (760) such as LiF is then deposited on top of the second nanoparticle layer by methods well known in the art. An Aluminum metal electrode 770 is deposited on top of the second nanoparticle layer to complete the nanostructured electroluminescent device.

Example 3

Another embodiment of a nanostructured electroluminescent display shown in FIG. 8. The ITO hole injection and first and second nanoparticle layers are formed as described in Example 2. A hole blocking layer made of $TiO_2$ (860) is deposited on top of the second nanoparticle layer by the methods well known in the art. An electron injecting layer (870) such as LiF is then deposited by methods well known in the art and an aluminum metal electrode (880) is deposited on top of the second nanoparticle layer to complete the nanostructured electroluminescent device.

Example 4

Figure 9:
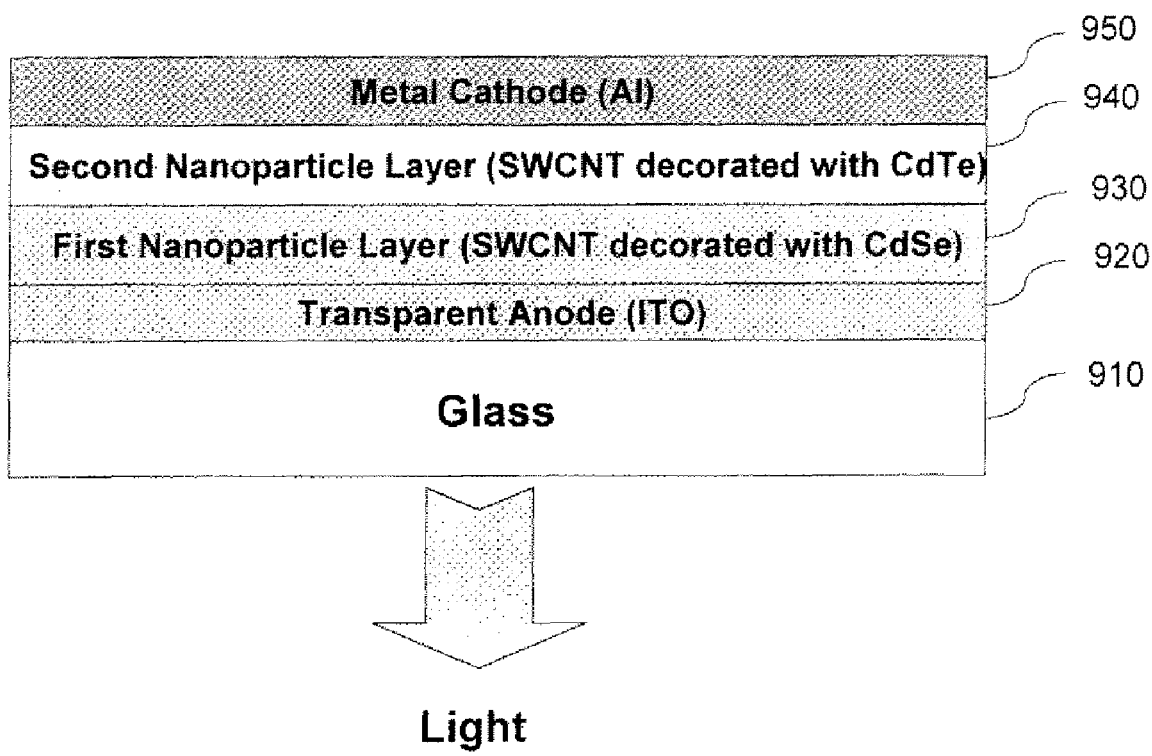

Another embodiment of a nanostructured electroluminescent display shown in FIG. 9. The ITO layer (920) is deposited on glass substrate (910), as described in Example 1, the first nanoparticle layer (930) is then deposited on the ITO layer as described in Example 1. The nanoparticles (CdSe dots, rods, bipods, tripods, multipods, wires) in this example are associated with a nanostructure such as the first nanoparticle layer (930) in this embodiment, made by decorating a functionalized single wall carbon nano tube (SWCNT). The second nanoparticle layer (940) is deposited directly on top of the first nanoparticle layer (930). As described in Example 1, the nanoparticles in the second layer (940), functionalized CdTe dots, rods, bipods, tripods, multipods or wires are associated with functionalized single wall carbon nanotubes (SWCNTs). An aluminum metal electrode (950) is then deposited on top of the second nanoparticle layer to complete the nanostructured electroluminescent device.

Example 5

Figure 10:
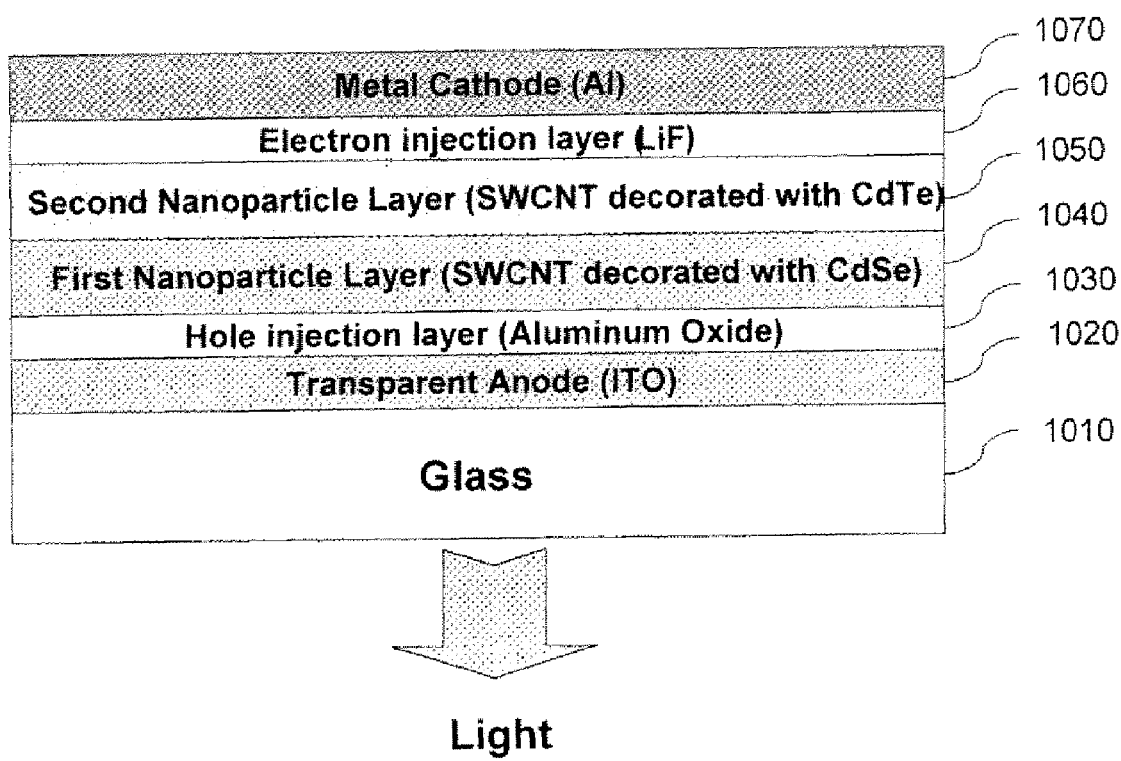

Another embodiment of a nanostructured electroluminescent display shown in FIG. 10. The ITO, first and second nanoparticle and metal cathode layers are formed as described in Example 4. However, in this embodiment, an electron injecting layer (1060) such as LiF is deposited on top of the second nanoparticle layer before an aluminum metal electrode (1070) is deposited on top of the second nanoparticle layer.

Example 6

Figure 11:
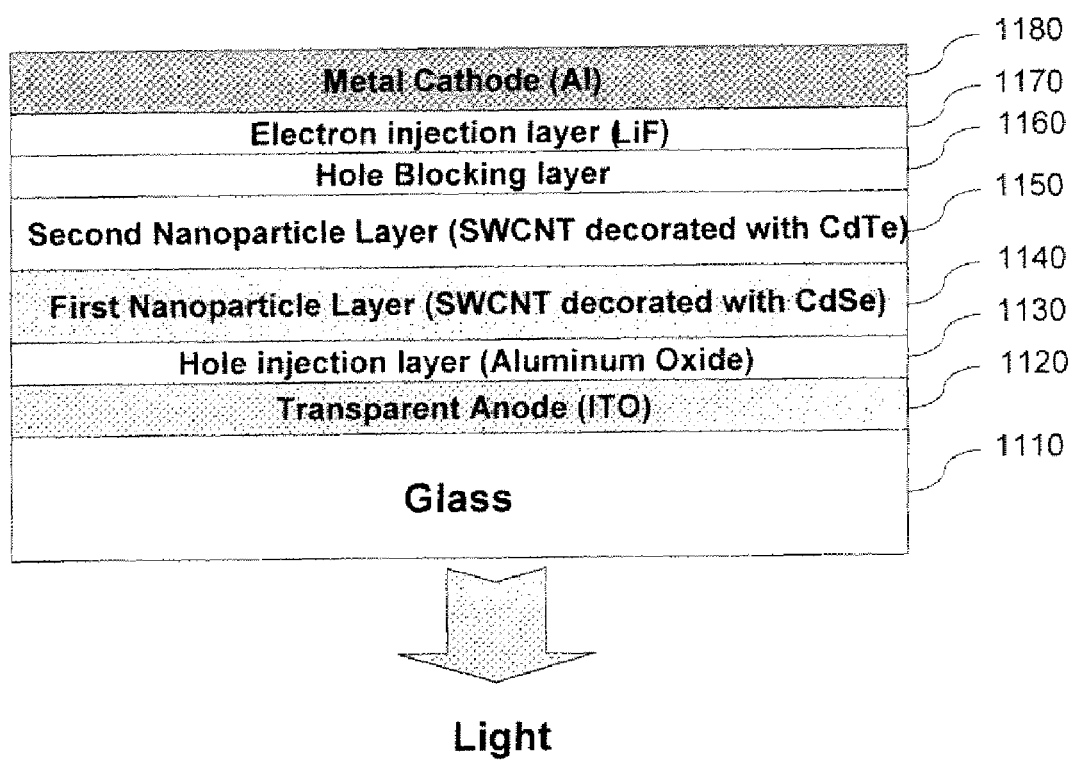

Another embodiment of a nanostructured electroluminescent device shown in FIG. 11. This device is made as described in Example 5, except a hole blocking layer (1160) is deposited on top of the second nanoparticle layer.

The thickness of the ITO layer used in the above embodiments is 100 nm and the thickness of the aluminum layer is 150 nm. The hole injection layer is about 5 Angstroms thick and the thickness of the electron injection layer is about 10 Angstroms. The nanoparticle layers have a thickness in the 10-100 nm range.

The above embodiments are some examples of the applying the present invention. It will be obvious to any one skilled in the art that other materials and material combinations well known in the art can be used in place of the material examples used in the above embodiments to build a nanostructure electroluminescent display according to the present invention. For example, other transparent conducting materials can be used as anode instead of ITO. Other metal oxides can be used as hole injection materials instead of aluminum oxide. Other metal halides can be used as electron injecting materials instead of LiF to build a nanostructure electroluminescent display according to the present invention. Other metals such as Ag, Ca can be used instead of Aluminum as cathode to build a nanostructure electroluminescent display according to the present invention. CdSe and CdTe nanoparticles are used as examples for the first and second nanoparticle layers. Other luminescent nanoparticles with suitable bandgaps can be used instead of CdSe and CdTe to build a nanostructure electroluminescent display according to the present invention.

The above embodiments show a bottom emitting display. It will be obvious to any one skilled in the art that a top emitting display can be built according to the present invention by using appropriate cathode and anode materials well known in the art.

The invention claimed is:

1. An electroluminescent device comprising
   first and second electrodes, at least one of which is transparent to radiation;
   a hole conducting layer comprising first hole-conducting nanoparticles;
   an electron conducting layer comprising second electron-conducting nanoparticles;
   an electron-hole recombination layer between said hole and electron conducting layers, wherein said electron-hole recombination layer comprises a metal or metal oxide in combination with said first or said second nanoparticles; and
   a voltage source capable of providing positive and negative voltage, where the positive pole of said voltage source is electrically connected to said first electrode and the negative pole is connected to said second electrode;
   wherein said hole conducting layer is between said first electrode and said electron-hole recombination layer; and
   wherein said electron conducting layer is between said second electrode and said electron-hole recombination layer.

2. The electroluminescent device of claim 1 wherein said electron-hole recombination layer comprises a layer of said metal or metal oxide.

3. The electroluminescent device of claim 1 wherein said electron-hole recombination layer comprises said metal or metal oxide in combination with said first and said second nanoparticles.

4. The electroluminescent device of claim 2 wherein said first and said second nanoparticles comprise at least one metal and wherein the metal of said electron-hole recombination layer comprises at least one of the metals of said first or second nanoparticles.

5. The electroluminescent device of claim 1 wherein said electron-hole recombination layer is a sintered layer.

6. The electroluminescent device of claim 1 wherein said electron-hole recombination layer is 5-10 nanometers thick.

7. The electroluminescent device of claim 1 further comprising a hole injection layer between said first electrode and said hole conducting layer.

8. The electroluminescent device of claim 7 wherein said hole injection layer comprises a p-type semiconductor, a metal or a metal oxide.

9. The electroluminescent device of claim 8 wherein said metal oxide of said hole injection layer comprises aluminum oxide, zinc oxide or titanium dioxide.

10. The electroluminescent device of claim 8 wherein said metal of said hole injection layer comprises aluminum, gold or silver.

11. The electroluminescent device of claim 8 wherein said p-type semiconductor is p-doped Si.

12. The electroluminescent device of claim 1 further comprising an electron injection layer between said second electrode and said electron conducting layer.

13. The electroluminescent device of claim 12 wherein said electron injection layer comprises a metal, a fluoride salt or an n-type semiconductor.

14. The electroluminescent device of claim 13 wherein said fluoride salt comprises NaF, CaF2, or BaF2.

15. An electroluminescent device comprising:
   first and second electrodes, at least one of which is transparent to radiation;
   a hole conducting layer comprising first hole-conducting nanoparticles;
   an electron conducting layer comprising second electron-conducting nanoparticles;
   an electron-hole recombination layer between said hole and electron conducting layers; and
   a voltage source capable of providing positive and negative voltage, where the positive pole of said voltage source is electrically connected to said first electrode and the negative pole is connected to said second electrode;
   wherein said hole conducting layer is between said first electrode and said electron-hole recombination layer;
   wherein said electron conducting layer is between said second electrode and said electron-hole recombination layer; and
   wherein said first and second nanoparticles are nanocrystals independently selected from the group consisting of quantum dots, nanorods, nanobipods, nanotripods, nanomultipods, or nanowires.

16. The electroluminescent device of 15 wherein said nanocrystals comprise quantum dots.

17. The electroluminescent device of claim 15 wherein said nanocrystals comprise CdSe, ZnSe, PbSe, CdTe, InP, PbS, Si or Group II-VI, II-IV or III-V materials.

18. The electroluminescent device of claim 15 further comprising a nanostructure in said hole conducting, electron conducting or electron-hole recombination layer.

19. The electroluminescent device of claim 18 where said nanostructure comprises a nanotube, nanorod or nanowire.

20. The electroluminescent device of claim 19 wherein said nanostructure comprises a carbon nanotube.

21. The electroluminescent device of claim 18 wherein a respective nanoparticle is covalently attached to said nanostructure.

22. An electronic device comprising the electroluminescent device of claim 1.

23. An electronic device comprising the electroluminescent device of claim 15.

* * * * *